Figure 1:
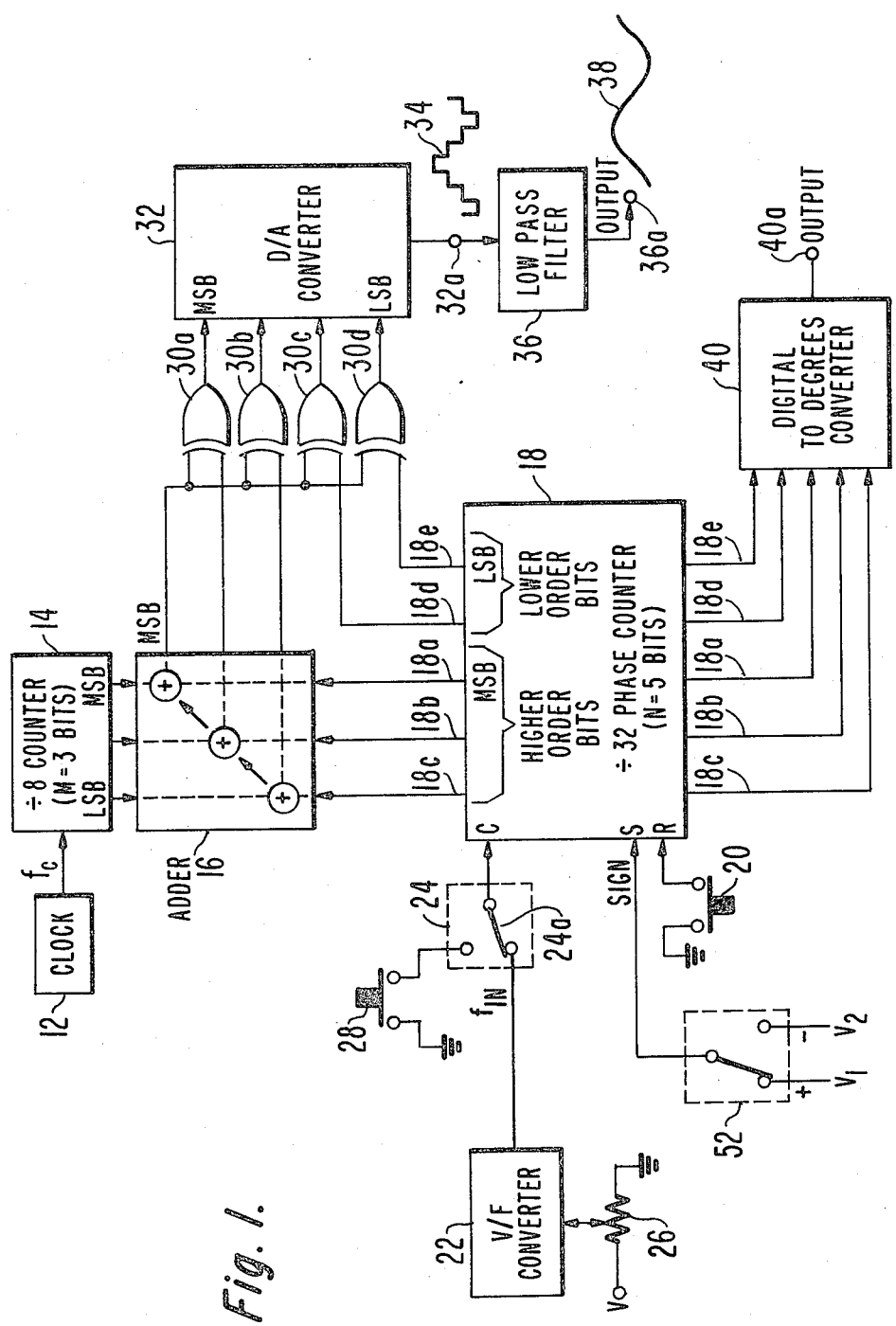

United States Patent [19]

Crowley

[11] 4,295,098

[45] Oct. 13, 1981

[54] DIGITALLY ADJUSTABLE PHASE SHIFTING CIRCUIT

[75] Inventor: Albert T. Crowley, Gloucester Township, Camden County, N.J.

[73] Assignee: RCA Corporation, New York, N.Y.

[21] Appl. No.: 105,122

[22] Filed: Dec. 19, 1979

[51] Int. Cl.³ .................. H03L 7/18; H03K 13/02; H03K 4/02; H03K 3/017

[52] U.S. Cl. ............................ 328/24; 328/14; 328/15; 328/55; 364/851

[58] Field of Search ............... 328/14, 15, 24, 55; 364/851

[56] References Cited

U.S. PATENT DOCUMENTS

| | | | |
|---|---|---|---|
| 3,325,721 | 6/1967 | Clark | 328/15 X |
| 3,500,213 | 3/1970 | Ameau | 328/14 |
| 3,792,360 | 2/1974 | Carlow | 328/14 |
| 4,061,909 | 12/1977 | Bryant | 364/851 |

Primary Examiner—John S. Heyman
Attorney, Agent, or Firm—Samuel Cohen; Robert L. Troike; Raymond E. Smiley

[57] ABSTRACT

A counter produces, as a function of time, an M bit count of cycles of a periodic signal. A storage device stores a changeable value represented by N bits comprising M higher order bits and N-M lower order bits. An adder produces M bits corresponding to the sum of M counter bits and M higher order bits. A digital-to-analog converter produces an alternating signal corresponding to the value of the M summed bits and N-M lower order bits where the phase of the alternating signal relative to an arbitrary reference signal corresponds to the value stored in the storage device.

6 Claims, 2 Drawing Figures

DIGITALLY ADJUSTABLE PHASE SHIFTING CIRCUIT

This invention is concerned with apparatus for producing an alternating signal and more particularly with apparatus for producing an alternating signal with an adjustable phase.

A number of prior art methods are known for producing, by means of an analog system, an alternating signal which can be adjusted in phase. Analog systems, unfortunately, lack the ability to precisely adjust the phase of the alternating signal. U.S. patent application, Ser. No. 036,012 filed May 4, 1979, by E. J. Nossen and assigned to the common assignee, describes a digital system which includes apparatus for producing an alternating signal with an adjustable phase. The Nossen structure utilizes a relatively complex and expensive accumulator to produce the alternating signal due to the need to produce an alternating signal of adjustable frequency. Further, although the phase is adjustable, there is no direct circuitry for determining the amount of the phase shift.

In accordance with an embodiment with the present invention, alternating signal producing apparatus includes means producing a periodic signal with a given period, divider means responsive to the periodic signal for producing a first digital signal changing as a function of the given period, and being manifested as M bits and means for storing a value representing the phase of the alternating signal and for producing in accordance with the value a second digital signal of M higher order bits and N-M lower order bits where $N \geq M$. The means for storing the value also has a control terminal for changing its stored value. The alternating signal producing apparatus also includes means responsive to the first and second digital signals for adding ones of the M bits and M higher order bits, means responsive to the added bits and lower order bits for producing an alternating signal corresponding to the value thereof and means for producing a control signal at the control terminal of the means for storing a value to change the stored value to thereby change the phase of the alternating signal.

Figure 2:
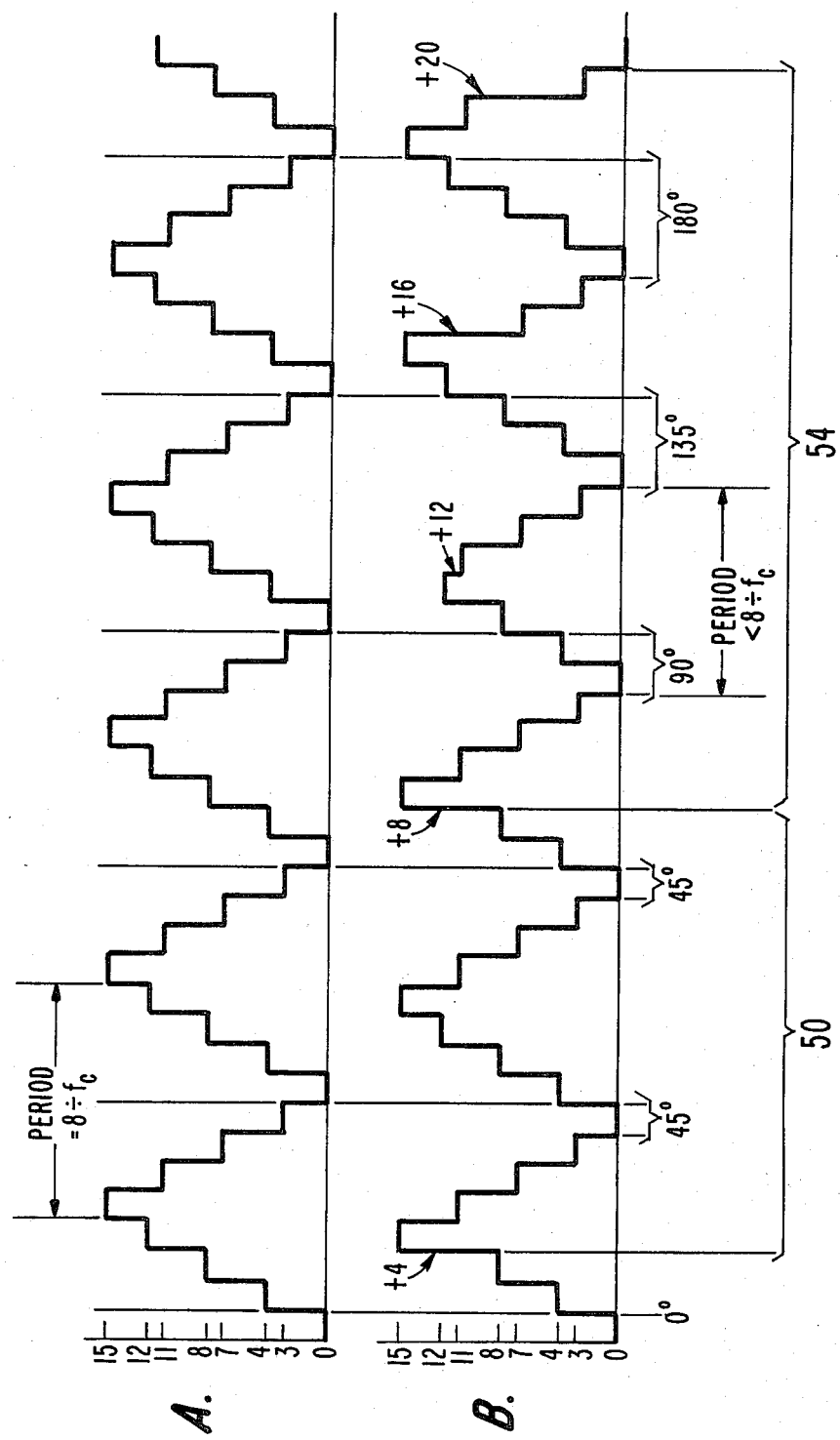

In the drawing:

FIG. 1 is an apparatus in logic and block diagram form for producing an alternating signal with adjustable phase shift in accordance with an embodiment of the invention; and FIGS. 2A and 2B are waveforms useful in understanding the operation of the apparatus of FIG. 1.

Referring to FIG. 1, a clock source 12 produces a periodic signal of frequency $f_c$ which signal may be in the form of pulses or an alternating signal. For example, clock source 12 may be a crystal controlled oscillator producing an alternating signal of precise frequency. Clock 12 is coupled to the input terminal of an M bit divider means such as a digital counter 14. Counter 14 is, by way of example, a three bit counter which has three output lines representing a most significant bit (MSB), a least significant bit (LSB) and an intermediate bit which are coupled to respective input terminals of a full adder 16.

Also, coupled to adder 16, are three higher order bit lines 18a, 18b, and 18c of a means for storing a value represented by N bits such as a second digital counter 18 capable of counting up and down and having, by way of example, five bit positions ranging from a LSB to a MSB. All of the output lines 18a through 18e of counter 18 are also coupled to a digital-to-degrees converter 40, which products on output line 40a (which may be a multiwire output) a signal indicative of the number of degrees represented by the value stored in counter 18 as will be explained hereinafter.

A frequency or pulse source of period $1 \div f_{in}$, such as a voltage-to-frequency converter 22, is coupled via a switch 24 to the count (c) terminal of counter 18. A means illustrated as a manual switch 52 supplies to terminal S of counter 18 is a sign $V_1$ or $V_2$ (count up or down) to determine whether the counter is to count up or down as input signals are received at the C terminal. The rate $f_{in}$, in turn, is determined by a voltage set in a potentiometer 26, by manual or automatic means (not shown).

An alternative source of input signals to the C terminal of counter 18 is a simple switch 28 which, upon command, (manual or by some other means) alters the count in counter 18. For the example of a counter responsive to ground level signals switch 28 as shown, when closed, increments or decrements the counter.

All but the MSB output of adder 16 and the lower order bit positions in counter 18 which are not added in adder 16 are supplied to respective ones of exclusve-OR gates 30a through 30d. The most significant bit position of adder 16 is coupled to each of the exclusive-OR gates 30a through 30d.

The output of each of the exclusive-OR gates is coupled to a digital-to-analog converter (D/A) 32 which produces at its output terminal 32a a stair-step waveform illustrated in general in waveform 34 and illustrated accurately in FIG. 2A. Terminal 32a of D/A 32 is coupled to a low pass filter 36 which provides a sine wave 38 of frequency equal to that of waveform 34.

Operation of the FIG. 1 apparatus will now be described with the initial assumption that counter 18 is reset to 0 by means of switch 20 and that switch 24 is in the position opposite to that shown, that is in the position to receive signals from switch 28. Then, as clock source 12 produces pulses or a sine wave or at rate $f_C$, counter 14 produces a sequence of binary numbers having the decimal equivalent 0,1,2, ... 6,7,0,1, ... advancing through one complete cycle of 0...7 at a rate of $f_C \div 8$ or a period $8 \div f_C$. Since counter 18 is producing all zeros, the output of adder 16 is equal to the output of counter 14. MSB from adder 16 is applied to exclusive-OR gates 30a through 30d. When the MSB from adder 16 is a logic 1 (for decimal counts of counter 14 of 4, 5, 6 or 7), it causes gates 30a through 30d to perform an inversion of polarity of bits supplied from adder 16 which are the binary equivalent of decimal numbers 4, 5, 6, and 7. Additionally, the logic 0 bits supplied to gates 30c and 30d are also inverted. Thus, in sequence, gates 30a through 30d produce the binary numbers having the decimal equivalent of 0, 4, 8, 12, 15, 11, 7, 3, 0, 4 etcetera. D/A 32 therefor produces at terminal 32a, as a function of time, the stair-step triangular-shaped waveform illustrated in FIG. 2A at a period $8 \div f_C$. The numbers 0, 3, 4, 7, 8, 11, 12 and 15 at the left of FIG. 2A (and FIG. 2B) are the decimal equivalents of the various binary numbers generated at the exclusive-OR gates 30a through 30d, although the numbers are generated in a sequence other than the above as will be described hereinafter. The stair-stepped waveform of FIG. 2A is converted to a sine wave by filter 36. In a practical circuit, the nonsymmetry of the FIG. 2A waveform is substantially less than illustrated in FIG. 2A and the nonsymmetry and quantizing steps are filtered out by filter 36.

If now switch 28 is arbitrarily depressed four times and consuming a positive or incrementing sign supplied to counter 18 from switch 52, the counter is advanced to a count of 4 on its five output lines 18a through 18e a logic 0, logic 0, logic 1, logic 0, and logic 0, respectively. The logic 1, on line 18c is added to the LSB of counter 14 by adder 16.

FIG. 2B portion 50, illustrates the effect of counter 18 being set to a count of 4. That effect is a phase advance of 45° in the waveform relative to the waveform of FIG. 2A, when counter 18 is set to all zeros. So long as counter 18 continues to be set to a count of 4, the phase of the waveform will continue to be advanced relative to the phase of the waveform when counter 18 is set to all zero.

If the count in counter 18 is further increased, the phase shift is greater than 45°. Conversely, if the count in counter 18 is decreased such as by supplying thereto a signal on line 52 indicative of a negative or decrementing sign and depressing switch 28 one or more times the phase of the waveform will be retarded. The count in counter 18 as represented by logic values on lines 18a through 18e is indicative of the phase difference. For example, lines 18a through 18e may pass the count value to a degree converter 40 which may then produce a signal at terminal 40a indicative of the amount of phase shift of the waveform, produced by the D/A 32. In the exemplary system a count of 4 in counter 18 corresponds to 45°. Therefore each count in counter 18 corresponds to 11.25° phase shift and a full count of 31 corresponds to 348.75° phase shift=360°−11.25° so that counter 18 is capable of causing a complete 360° phase shift.

It is also possible to change the frequency of the waveform produced by D/A 32 relative to frequency, $f_C \div 8$. It is known to those skilled in the art that the frequency is determined by the rate of change if it is phase. Therefore, if an additional phase change to the alternating signal is made at a uniform rate, the frequency of the alternating signal will be changed.

The circuit of FIG. 1 is capable of altering the frequency of signal produced at terminal 36a. This is accomplished by positioning arm 24a of switch 24 as illustrated. Then, voltage-to-frequency converter 22 produces a signal at a rate $f_{in}$ which is applied to the C terminal of counter 18 to thereby advance or decrement counter 18 at a rate $f_{in}$. If source 52 produces a signal indicative of a plus or incrementing sign, counter 18 will advance. Conversely, if source 52 produces a signal indicative of a minus or decrementing sign, counter 18 will decrement. The rate $f_{in}$ is determined by the setting of potentiometer 26.

FIG. 2B portion 54, illustrates what happens when counter 18 is advanced at a uniform rate. For ease of illustration, the advance is shown in multiples of 4 counts for successive cycles of the waveform in FIG. 2A. In a practical system, the advance is one count at a time and may be more or less than one count per cycle of the FIG. 2A waveform. It will be noted from FIG. 2A, portion 54, that whenever counter 18 is advanced 4 counts, the D/A output 32a advances 45° relative to the waveform in FIG. 2A. The effect is a period which is less than that of the waveform of FIG. 2A and hence at a higher frequency. Also the count in counter 18, is continuously indicative of the phase shift of the waveform. The frequency of the signal appearing at terminal 36a, $f_{out}$ is related to the clock frequency $f_C$ and the frequency $f_{in}$ produced by converter 22 by the following equation:

$$f_{out} = (f_C/2^M) \pm (f_{in}/2^N) \qquad (1)$$

where M and N are the number of bits in counters 14 and 18, respectively. The sign will be determined by whether the phase counter 18 is counting up or down. The decision as to the values of M, N, $f_C$ and, if utilized, $f_{in}$ will be determined by desired system parameters. It should be realized the number of bits of capacity in counter 18 determines the resolution of the phase shift. Thus, for example in a practical circuit, counter 18 may be a 10-bit counter capable of counting to 1024 in decimal notation, the phase of the waveform produced by D/A 32 can be changed and increments of $360° \div 1024 \approx 0.35°$. Also, the number of steps (i.e., quantizing levels) in one cycle of the signal produced at terminal 32a for a given quality of filter 36 determines the degree to which waveform 38 of FIG. 1 approaches a true sine wave. A four bit counter 14 with available filter techniques will result in an acceptable sine wave being produced at terminal 36a.

What is claimed is:

1. Apparatus for producing an alternating signal with a controllable phase shift, comprising in combination:
    means producing a periodic signal having a given period;
    divider means responsive to said periodic signal for producing a first digital signal changing as a function of said given period and manifested as a plurality of M bits;
    means for storing a value indicative of the phase of said alternating signal and for producing, in accordance with said value, a second digital signal manifested as a plurality of N bits comprising M higher order bits and N-M lower order bits and having a control terminal receptive of a control signal for changing said value, where, $N \geq M$;
    means responsive to said first digital signal and second digital signal for adding ones of said M bits of said first digital signal with corresponding ones of said higher orders bits of said N bits to produce a most significant bit (MSB) and lower order bits;
    means responsive to said added bits and lower order ones of said N bits for producing an analog alternating signal corresponding to the value of said added and lower order bits; and
    means coupled to said means for storing a value for producing a control signal to change said stored value to thereby change the phase of said alternating signal.

2. The combination as set forth in claim 1, wherein said divider means is an M bit digital counter responsive to each cycle of said periodic signal for advancing by one count.

3. The combination as set forth in claim 1, or claim 2, wherein said means for storing a value is an N bit digital counter storing a count representing said phase of said alternating signal responsive to said control signal for changing the count contained therein.

4. The combination as set forth in claim 1, or claim 2, wherein said means responsive to said added bits and lower order bits comprises N-1 exclusive-OR gates all receptive of said MSB, each receptive of a different one of said added bits other than said MSB and lower order ones of said N bits and further comprising a digital-toanalog converter means responsive to the output of said N-1 exclusive-OR gates for producing said analog alternating signal.

5. The combination as set forth in claim 4, wherein said means for producing said control signal comprises means for continually changing said stored value at a uniform rate to thereby alternate the frequency of said analog signal.

6. The combination as set forth in claim 5, wherein said means for continually changing said stored value comprises a voltage-to-frequency converter means and means for supplying a selected voltage thereto for determining said frequency.

* * * * *